United States Patent [19]
Kleinhenz et al.

[11] Patent Number: 6,107,135
[45] Date of Patent: *Aug. 22, 2000

[54] METHOD OF MAKING A SEMICONDUCTOR MEMORY DEVICE HAVING A BURIED PLATE ELECTRODE

[75] Inventors: Richard L. Kleinhenz, Wappingers Falls; Gary B. Bronner, Stormville; Junichiro Iba, Wappingers Falls, all of N.Y.

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/021,993

[22] Filed: Feb. 11, 1998

[51] Int. Cl.$^7$ .......................... H01L 21/8242; H01L 21/20
[52] U.S. Cl. ............................................. 438/249; 438/392
[58] Field of Search .................................. 438/243–249, 438/386–392

[56] References Cited

U.S. PATENT DOCUMENTS

| | | |
|---|---|---|
| 4,569,701 | 2/1986 | Oh . |
| 4,755,486 | 7/1988 | Treichel et al. . |
| 4,782,036 | 11/1988 | Becker et al. . |
| 4,889,492 | 12/1989 | Barden et al. . |
| 4,906,590 | 3/1990 | Kanetaki et al. . |
| 4,994,409 | 2/1991 | Yoon et al. . |
| 4,996,168 | 2/1991 | Ozaki et al. . |
| 4,999,312 | 3/1991 | Yoon . |
| 5,106,774 | 4/1992 | Hieda et al. . |
| 5,120,677 | 6/1992 | Wakamatsu . |
| 5,173,440 | 12/1992 | Tsunashima et al. . |
| 5,182,224 | 1/1993 | Kim et al. . |
| 5,202,279 | 4/1993 | Chung et al. . |
| 5,264,716 | 11/1993 | Kenney . |
| 5,324,686 | 6/1994 | Tsunashima . |
| 5,348,905 | 9/1994 | Kenny . |
| 5,614,431 | 3/1997 | DeBrosse . |
| 5,618,751 | 4/1997 | Golden et al. ........................ 438/392 |
| 5,656,535 | 8/1997 | Ho et al. ............................. 438/386 |

OTHER PUBLICATIONS

L. Nesbit, et al., A 0.6 $\mu m^2$ 256Mb Trench DRAM Cell With Self–Aligned BuriEd Strap (BEST), IEEE, 1 pg., (1993).

*Primary Examiner*—Richard Booth
*Attorney, Agent, or Firm*—Banner & Witcoff, Ltd.

[57] ABSTRACT

A method of forming a buried plate electrode for a trench capacitor of a semiconductor memory device is provided. Trenches are formed in a semiconductor substrate and a dopant source film is formed on the sidewalls and bottom walls of the trenches. A resist is formed on the dopant source film which fills in the trenches. The resist is recessed to remain in the trenches at a level which is below the surface of the semiconductor substrate. Impurities are implanted into the semiconductor substrate using the recessed resist as a block mask. The dopant source film is etched using the recessed resist as an etching mask and the recessed resist is then removed. The implanted impurities and dopants from the dopant source film are diffused into the semiconductor substrate to form a buried plate electrode.

14 Claims, 3 Drawing Sheets

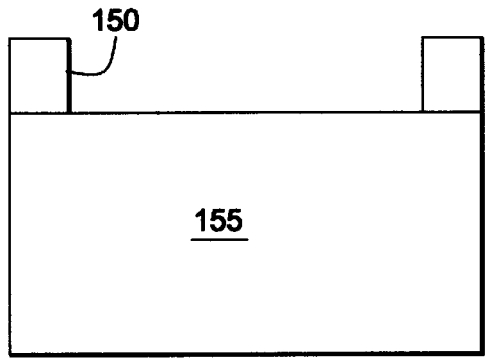
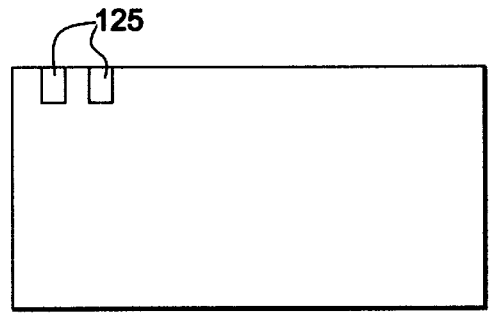
FIG. 1(a)  FIG. 1(b)
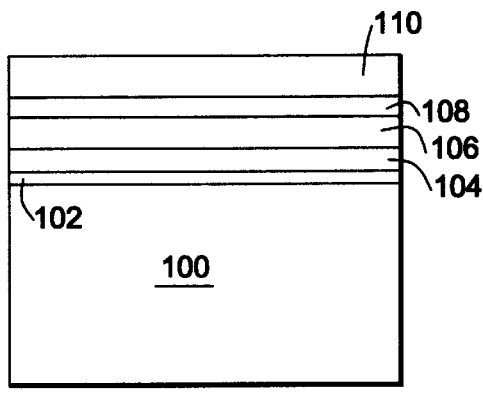
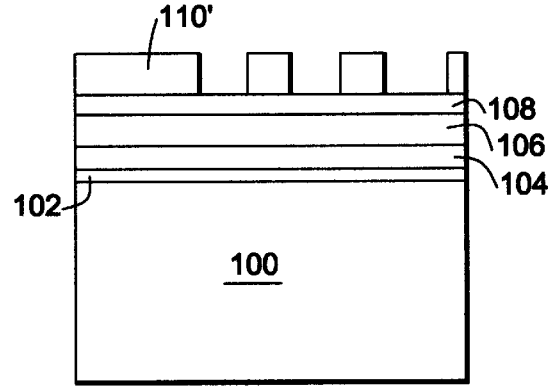
FIG. 2(a)  FIG. 2(b)

METHOD OF MAKING A SEMICONDUCTOR MEMORY DEVICE HAVING A BURIED PLATE ELECTRODE

TECHNICAL FIELD

The present invention generally relates to a method of making a semiconductor device and, more particularly, to a method of making a semiconductor memory device having a buried plate electrode.

BACKGROUND

In order to provide highly integrated dynamic random access memories (DRAMs), memory cells which utilize trench capacitors for storing data have been developed. One such memory cell is described in Nesbit et al., A 0. 6 $\mu m^2$ 256 Mb Trench DRAM Cell with Self-Aligned BuriEd STrap (BEST), IEDM 93-627. As described in U.S. Pat. No. 5,618,751, a buried plate electrode may be provided within the semiconductor substrate in which the trench capacitors are formed. The buried plate electrode provides the capability of controlling the voltage on one plate of each of a plurality of capacitors, rather than controlling the voltage on the substrate. Altering the voltage on a plate of a plurality of capacitors during read or write operations can be used to increase operating margins. Further, by partitioning the buried plate electrode, the current required to alter the voltage thereon can be reduced. Independent control of the voltage of the buried plate electrode and the semiconductor substrate avoids interference between the capacitors of the memory and transistors in peripheral circuits (e.g., sense amplifiers, addressing circuits) also formed on the substrate. Still further, the buried plate electrode allows the voltage across the capacitor dielectric to be limited.

In a DRAM such as the DRAM in the above-identified Nesbit article, a buried plate electrode (or buried well) is constituted by N-type impurity regions (which are formed by outdiffusing impurities from the trenches) and an N-well band formed by implantation (which connects together the outdiffused impurity regions). The outdiffusion results by providing a dopant source layer on the sidewalls of the deep trenches, patterning the dopant source film using a resist which is recessed to a level within the trench which is below the surface of the semiconductor substrate, stripping the resist, and annealing to outdiffuse the impurities. While it is possible for the buried plate electrode to be formed by outdiffusing the impurities so that one continuous region is formed, thereby eliminating the need for the N-well band, such a process is very sensitive to defects. For example, if trenches are missing, a substrate leakage current can result. In addition, the lateral resistivity of the buried plate electrode can be reduced using the N-well band.

The implantation for the N-well band is conventionally performed prior to etching the deep trenches in which the storage node capacitors are formed. This is disadvantageous for the following reasons. The N-well band implantation is performed using a patterned thick resist film 150 formed on a semiconductor substrate 155 as a block mask as shown in FIG. 1(a). The subsequently formed deep trenches must be aligned to this implantation. However, since there is no surface pattern after the implant it is difficult to align the mask for forming the deep trenches to the implantation. In order to overcome this problem, a first mask (a so-called zero level (ZL) mask) may be utilized for providing alignment marks 175 at the corner of the chip as shown in FIG. 1(b). In this case, the implant mask and the deep trench mask are aligned using these alignment marks. While this overcomes the alignment problems, the process requires several masks in addition to the deep trench mask. These additional masks complicate the manufacturing process by requiring additional process steps. These additional steps also increase the overall processing time and costs.

SUMMARY OF THE INVENTION

In accordance with the present invention, a resist film (or other convenient film), which has been recessed so as to remain at a level below the openings of trenches formed in a semiconductor substrate, serves both as a block mask for implanting impurities and as a mask for patterning a dopant source film. Specifically, impurities are implanted using the recessed resist as a block mask and the dopant source film is etched using the same recessed resist as an etch mask. The implanted impurities and the dopants from the dopant source film are diffused into the semiconductor substrate to form a buried plate electrode.

By providing an impurity band for connecting together the impurity regions which are outdiffused from the trenches, the process for forming a buried plate electrode is less sensitive to defects and the lateral resistivity of the buried plate electrode may be reduced. The recessed resist serves both as a block mask for ion implantation for forming the impurity band and as a mask for patterning the dopant source film. There is no need to form either a zero layer mask for forming alignment marks or a separate block mask for the ion implantation for the impurity band. This reduces the number of process steps and thereby simplifies the overall manufacturing process. The reduction in the number of process steps reduces the processing time and costs. Further, an annealing process for diffusing the implanted impurities and the dopants from the dopant source film serves to remove implant damage.

These and other features and aspects of the invention will be more clearly understood and better described if the following detailed description is read in conjunction with the appended drawings.

BRIEF DESCRIPTION OF THE DRAWINGS

FIG. 1(a) illustrates a block mask arranged on a semiconductor substrate for an impurity implant.

FIG. 1(b) illustrates alignment marks formed on a semiconductor substrate.

FIGS. 2(a)–2(h) illustrate a method in accordance with the present invention.

DETAILED DESCRIPTION

Figure 4:
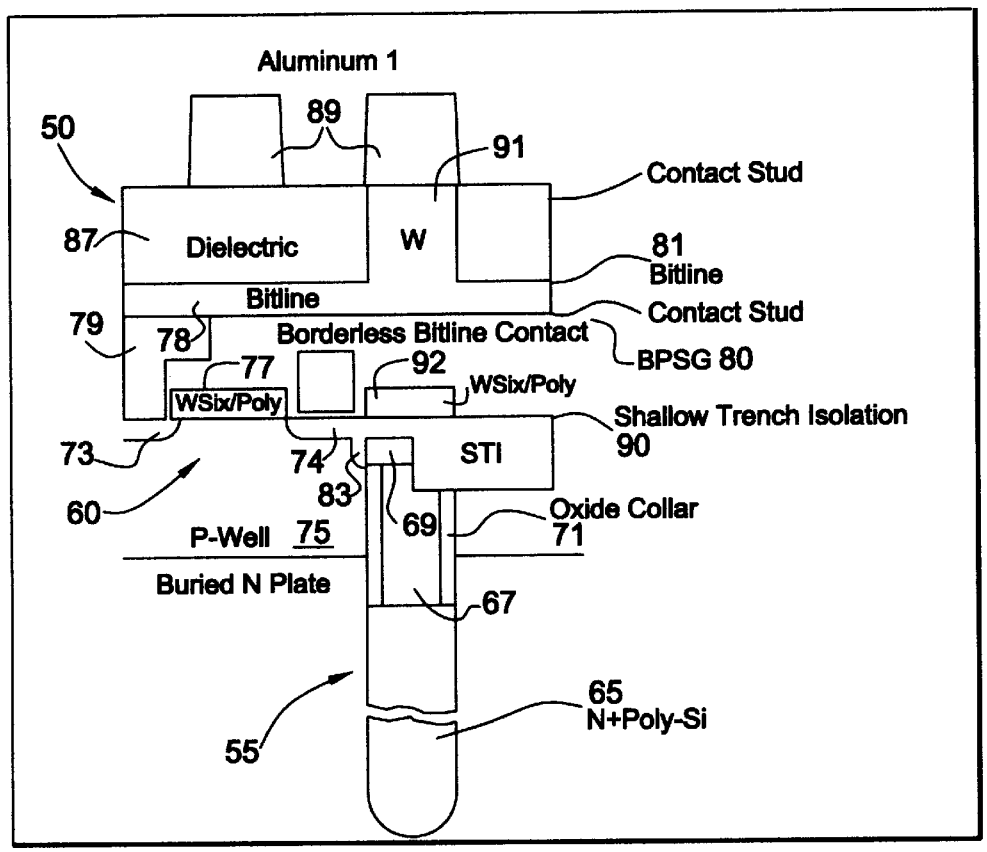
FIG. 4 is a cross-sectional view of a memory cell of a dynamic random access memory device (DRAM).

FIGS. 2(a)–2(h) illustrate a method in accordance with the present invention. This method may be used to form a buried plate electrode for a DRAM such as a DRAM shown and described in the above-identified Nesbit et al. article. A cross-sectional view of a memory cell of the DRAM described in the Nesbit et al. article is shown in FIG. 4. Of course, the teachings of the present invention are not limited to being applied to the DRAM of FIG. 4, but are generally applicable to semiconductor memory devices including buried plate electrodes. Briefly, the DRAM cell 50 of FIG. 4 includes a trench capacitor 55 and a MOS transfer gate 60. Trench capacitor 55 includes a first N+–type polycrystalline silicon fill 65, a second polycrystalline silicon fill 67, and a collar oxide 71. Transfer gate 60 includes N-type source/drain and drain/source regions 73 and 74 formed in P-type well 75 and a WSix/polycrystalline silicon gate 77 insulatively spaced from the channel region between source/drain region 73 and drain/source region 74. A bit line contact 79 formed in an opening in an insulating layer 80 (of BPSG, for example) and in insulating layer 78 (of silicon nitride, for example) electrically connects source/drain region 73 to bit line 81. A shallow trench isolation (STI) structure 90 electrically isolates DRAM cell 50 from an adjacent DRAM cell and passing word line 92. Passing word line 92 has a WSix/polycrystalline silicon structure. A dielectric layer 87 is formed on bit line 81 and aluminum wirings 89 are formed on dielectric layer 87. One of the aluminum wirings 89 is connected to bit line 81 by a contact stud 91 of tungsten, for example. A diffusion region 83 electrically connects third polycrystalline silicon fill 69 and drain/source region 74 of MOS transfer gate 60. This diffusion region is formed by outdiffiusing dopants from the highly doped polycrystalline silicon fill in the storage trench into P-well 75. Diffusion region 83 and third polycrystalline silicon fill 69 constitute a buried strap for connecting trench capacitor 55 to transfer gate 60.

Figure 2C:
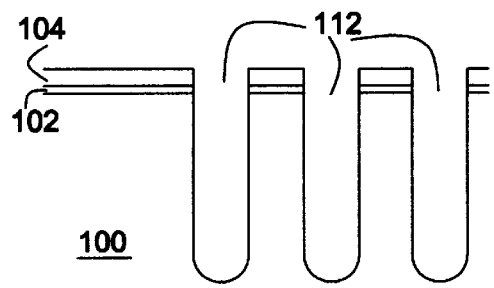

Turning to FIG. 2(a), a P-type semiconductor (e.g., silicon) substrate 100 has a first pad silicon dioxide ($SiO_2$) film 102, a pad silicon nitride ($Si_3N_4$) film 104, and a second pad silicon dioxide layer 106 successively formed on an upper surface thereof. First pad silicon dioxide film 102 has a thickness of about 10 nanometers and is formed, for example, by thermal oxidation at about 900° C. Pad silicon nitride layer 104 has a thickness of about 100–250 nanometers (e.g., 220 nanometers) and is formed, for example, by chemical vapor deposition (CVD). Second pad silicon dioxide film 106 has a thickness of about 700 nanometers and is formed, for example, by a CVD of tetra ethyl orthosilicate (TEOS). An antireflective coating (ARC) film 108 (such as BARL available from Shipley) is formed on an upper surface of second pad silicon dioxide film 106 and a resist film 110 is formed on the upper surface of ARC film 108. Resist film 110 may be, for example, APEX-E or UV2HS available from Shipley. Other types of resist films may be utilized including by way of example, but not limitation, chemically amplified resists, non-chemically amplified resists, positive-type resists, and negative-type resists. Resist film 110 is selectively exposed using a mask (not shown) and developed to form a patterned resist 110 as shown in FIG. 2(b). The exposure tool may, for example, be a Micrascan-series exposure tool available from SVGL, Inc. In advanced lithography, a 193 nanometer single-band ArF excimer laser may be used. Deep trenches 112 are etched by reactive ion etching (RIE) using patterned resist film 110' as an etching mask. TEOS pad silicon dioxide film 106, pad silicon nitride film 104, and pad silicon dioxide film 102 are etched using, for example, a $CHF_3$-$CF_4$ mixed gas. Silicon substrate 100 is etched using, for example, HBr, $O_2$, or $NF_3$. Deep trenches 112 have a depth of about 8 micrometers. Patterned resist 110', the remaining ARC film 108, and the remaining second pad TEOS film 106 are then removed, leaving a structure as shown in FIG. 2(c).

Figure 2D:
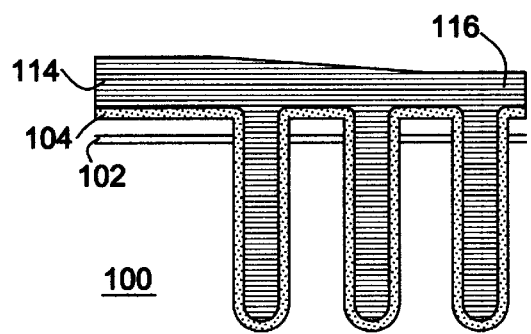
Figure 2E:
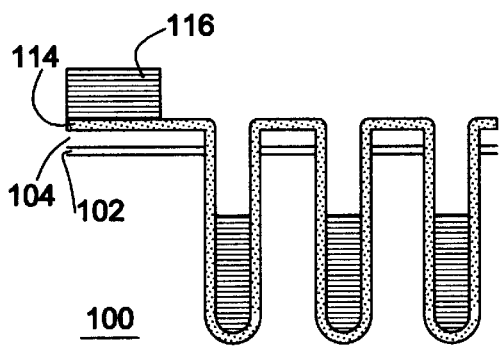
Figure 2F:
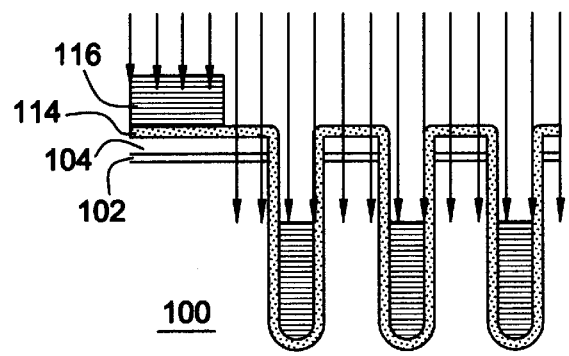

With reference to FIG. 2(d), a dopant source film 114 having a thickness of between about 10–100 nanometers (e.g., 40 nanometers) is then formed by low pressure chemical vapor deposition on the upper surface of pad silicon nitride film 104 and on the sidewalls and bottom walls of deep trenches 112. Dopant source film 114 contains N-type impurities with an impurity concentration of more than about $1 \times 10^{20}$ $cm^{-3}$ and is, for example, an arsenic glass (AsG) film or a phosphorus glass film. An i-line resist film 116 (such as AZ75XX series available from Hoechst) having a thickness of about 3 micrometers is formed on the upper surface of dopant source film 114 and to fill in deep trenches 112. Resist film 116 is then exposed using a mask (not shown) with radiation having a wavelength of 365 nanometers for a time period which is suitable for the sensitivity of the particular resist being used. In the case of AZ7523 from Hoechst, this time period may be about 800 milliseconds. In general, the dose is determined by the amount it is desired to recess the resist below the surface of the semiconductor substrate. A dose of 800 milliseconds for the AZ7523 resist using exposure radiation having a wavelength of 365 nanometers is sufficient so that, after development, resist film 116 is recessed in deep trenches 112 to a depth of about 1.5 micrometers below the surface of semiconductor substrate 100 as shown in FIG. 2(e). With reference to FIG. 2(f), phosphorus (or some other N-type impurity such as arsenic) is then ion implanted to a depth of about 1.5 micrometers below the surface of semiconductor substrate 100. In the case of doubly charged phosphorus, for example, a dose of about $1 \times 10^{13}$ $cm^{-2}$ and an acceleration voltage of about 750 kV (i.e., an implantation energy of 1.5 MeV) are used. In the case of singly charged phosphorus, an acceleration voltage of 1.5 MV is used. The remaining resist film 116 serves as a block mask for the ion implantation. Dopant source film 114 in the upper part of the trench (i.e., the portion of dopant source film 114 not covered by resist film 116) forms a sacrificial layer for screening impurities present during the ion implantation step. This sacrificial layer serves to prevent low-energy metal contaminants such as aluminum, iron, and nickel from contaminating the silicon substrate.

Figure 2G:
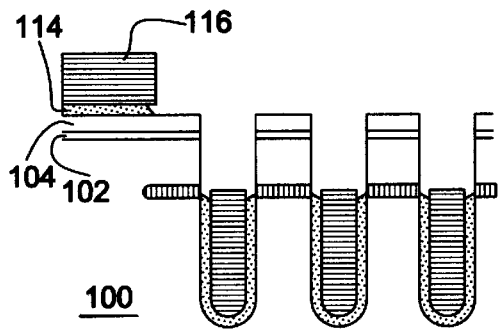
Figure 2H:
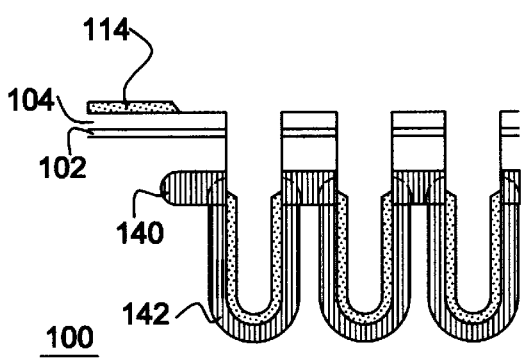

With reference to FIG. 2(g), dopant source film 114 is then etched by an etching process using the remaining resist 116 as a mask. The etching process for etching dopant source film 114 may utilize HF, buffered HF, or be some suitable vapor etch process. Resist film 116 is then stripped using $O_2$ ashing and/or an $H_2SO_4$/$H_2O_2$ mixture and the buried plate electrode is diffused by annealing at a temperature of about 1050° C. for 30 minutes. As a result of the diffusion, an N-well band 140 having a peak concentration of about $3 \times 10^{17}$ $cm^{-3}$ at a depth of about 1.5 micrometers below the surface of the semiconductor substrate is formed as shown in FIG. 2(h). In addition, arsenic is diffused into semiconductor substrate 100 to form outdiffused regions 142. These outdiffused regions have an impurity concentration at the silicon interface of greater than about $2 \times 10^{19}$ $cm^{-3}$. The annealing to form the N-well band and the outdiffused regions also serves as a damage removal step for removing damage caused by the ion implantation. Subsequently, the remaining portion of dopant source film 114 is removed by an etching process. After this, conventional processing steps for completing the trench capacitor are carried out. For example, the steps may include: the deposition of a node dielectric by low pressure chemical vapor deposition (LPCVD) of silicon nitride; the reoxidation of the node dielectric; the deposition of a first polysilicon fill using LPCVD; the chemical mechanical polishing (CMP) of the first polysilicon fill; the etching of a first recess in the first polysilicon fill using RIE; the removal of the node dielectric film at the upper portion of the trench; the deposition of a collar oxide; the etching of the collar oxide using RIE; the deposition of a second polysilicon fill using LPCVD; the CMP of the second polysilicon fill; and the forming of a strap for connecting the deep trench capacitor to the transfer gate of the memory cell. This strap may be formed, for example, by recessing the second polysilicon fill and the collar oxide using RIE; the deposition of a third polysilicon fill by LPCVD; the CMP of the third polysilicon fill; and the recessing of the third polysilicon fill by RIE to a level which is about 50 nanometers below the surface of semiconductor substrate 100. Generally, one or more of the polysilicon fills contains impurities which are outdiffused to the semiconductor substrate during the manufacturing process via the third polysilicon fill to form a connection to an impurity region of the transfer gate. The transfer gate is formed in accordance with any conventional process.

A standard reach-though implant (not shown) in a region of the substrate away from the memory cell array is used to contact the buried plate, whereby potentials may be applied thereto.

By providing an impurity band for connecting together the impurity regions which are outdiffused from the trenches, the process for forming a buried plate electrode is less sensitive to defects and the lateral resistivity of the buried plate electrode may be reduced. In accordance with the method of the present invention, resist 116 serves both as a block mask for ion implantation and as a mask for patterning dopant film 114. There is no need to form either a zero layer mask for forming alignment marks or a separate block mask for the ion implantation for the N-well. Thus, only one mask in addition to the deep trench mask is required. This reduces the number of process steps and thereby simplifies the overall manufacturing process. In addition, the reduction in the number of process steps reduces the processing time. Further, the annealing process for diffusing the implanted impurities and the dopants from the dopant source film serves to remove implant damage.

EXAMPLE

Figure 3:
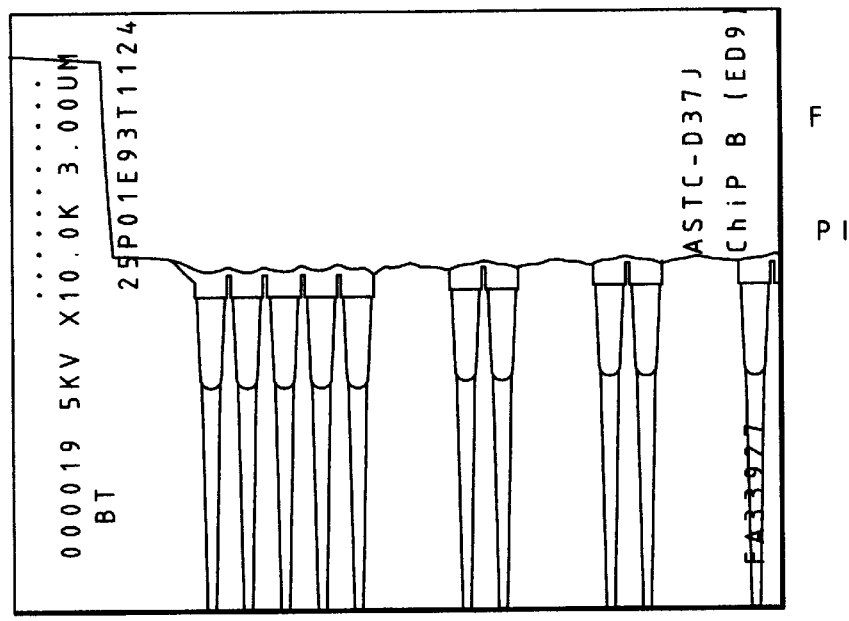
FIG. 3 is a scanning electron microscope picture of an array edge processed in accordance with the present invention.

FIG. 3 is a scanning electron microscope cross-section of an array edge after the selective etching of the dopant source film 114 during the method of the present invention described above. The cross-sectional view of FIG. 3 corresponds to the cross-sectional view of FIG. 2(*g*).

Any patent or technical document referred to above is incorporated herein by reference.

While there has been shown and described the preferred embodiments of the invention, it will be evident to those skilled in the art that various modifications may be made thereto without departing from the spirit and scope of the invention as set forth in the appended claims.

We claim:

1. A method of forming a buried plate electrode for a trench capacitor of a semiconductor memory cell, the method comprising the steps of:

forming trenches in a semiconductor substrate;

forming a dopant source film on the sidewalls and bottom walls of said trenches;

forming a resist on said dopant source film which fills in said trenches;

recessing said resist to remain in said trenches at a level which is below the surface of said semiconductor substrate;

implanting impurities into said semiconductor substrate using the recessed resist as a block mask;

etching said dopant source film using the recessed resist as an etching mask;

removing said recessed resist; and diffusing the implanted impurities and dopants from said etched dopant source film into said semiconductor substrate to form said buried plate electrode.

2. The method according to claim 1, wherein said dopant source layer comprises an arsenic glass layer.

3. The method according to claim 1, wherein the implanted impurities comprise phosphorus.

4. The method according to claim 1, wherein said dopant source film has a thickness in a range from about 10 to 100 nanometers.

5. The method according to claim 1, wherein the implanted impurities and the dopants from said dopant source film are diffused by an annealing process.

6. The method according to claim 1, wherein the peak impurity concentration of the implanted impurities diffused into said semiconductor substrate is about $3\times10^{17}$ cm$^{-3}$.

7. The method according to claim 1, wherein the impurity concentration of the dopants from said dopant source film diffused into said semiconductor is greater than about $2\times10^{19}$ cm$^{-3}$ at the interface between said dopants and said semiconductor substrate.

8. A method of forming trench capacitors of a semiconductor memory cell, the method comprising the steps of:

forming trenches in a semiconductor substrate;

forming a dopant source film on the sidewalls and bottom walls of said trenches;

forming a resist on said dopant source film which fills in said trenches;

recessing said resist to remain in said trenches at a level which is below the surface of said semiconductor substrate;

implanting impurities into said semiconductor substrate using the recessed resist as a block mask;

etching said dopant source film using the recessed resist as an etching mask;

removing said recessed resist;

diffusing the implanted impurities and dopants from said etched dopant source film into said semiconductor substrate to form said buried plate electrode;

removing said etched dopant source film; and forming said trench capacitors in said trenches.

9. The method according to claim 8, wherein said dopant source layer comprises an arsenic glass layer.

10. The method according to claim 8, wherein the implanted impurities comprise phosphorus.

11. The method according to claim 8, wherein said dopant source film has a thickness in a range from about 10 to 100 nanometers.

12. The method according to claim 8, wherein the implanted impurities and the dopants from said dopant source film are diffused by an annealing process.

13. The method according to claim 8, wherein the peak impurity concentration of the implanted impurities diffused into said semiconductor substrate is about $3\times10^{17}$ cm$^{-3}$.

14. The method according to claim 8, wherein the impurity concentration of the dopants from said dopant source film diffused into said semiconductor is greater than about $2\times10^{19}$ cm$^{-3}$ at the interface between said dopants and said semiconductor substrate.

* * * * *

UNITED STATES PATENT AND TRADEMARK OFFICE
CERTIFICATE OF CORRECTION

PATENT NO.: 6,107,135

DATED: August 22, 2000

INVENTOR: Richard L. KLEINHENZ, et al.

It is certified that an error appears in the above-identified patent and that said Letters Patent is hereby corrected as shown below:

On the cover page, in Assignee [73] information:

Please add --International Business Machines Corporation, Armonk, New York--.

Signed and Sealed this

Twenty-fourth Day of April, 2001

Attest:

NICHOLAS P. GODICI

Attesting Officer

Acting Director of the United States Patent and Trademark Office